(12) United States Patent
Nakamura

(10) Patent No.: US 6,366,151 B1
(45) Date of Patent: Apr. 2, 2002

(54) WAVEFORM CORRECTION CIRCUIT

(75) Inventor: Kazuyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/675,638

(22) Filed: Sep. 29, 2000

(30) Foreign Application Priority Data

Sep. 29, 1999 (JP) .......................................... 11-275438

(51) Int. Cl.⁷ .............................................. H03K 17/16
(52) U.S. Cl. ...................... 327/281; 327/112; 327/391
(58) Field of Search .............................. 327/105, 107, 327/112, 170, 171, 172, 175, 176, 242, 251, 253, 258, 259, 281, 291–296, 299, 384, 389, 391, 392, 394, 427, 431, 434, 337

(56) References Cited

U.S. PATENT DOCUMENTS

| | | | | |
|---|---|---|---|---|
| 4,827,157 A | * | 5/1989 | Machida et al. ............ | 307/262 |
| 5,023,472 A | * | 6/1991 | Hashimoto et al. ......... | 327/108 |
| 5,198,699 A | * | 3/1993 | Hashimoto et al. ......... | 307/270 |
| 5,668,488 A | * | 9/1997 | Sharpe-Geisler et al. ... | 327/108 |
| 5,764,091 A | * | 6/1998 | Sumita et al. .............. | 327/175 |
| 5,923,192 A | * | 7/1999 | Hasegawa ................... | 327/112 |
| 6,198,322 B1 | * | 3/2001 | Yoshimura .................. | 327/175 |
| 6,198,334 B1 | * | 3/2001 | Tomobe et al. ............. | 327/391 |
| 6,225,847 B1 | * | 5/2001 | Kim ........................... | 327/257 |

* cited by examiner

*Primary Examiner*—My-Trang Nu Ton
(74) *Attorney, Agent, or Firm*—Scully, Scott, Murphy & Presser

(57) ABSTRACT

A duty ratio correction circuit includes a pair of circuit blocks each having an input stage inverter for receiving one of complementary clock signals, a first waveform correction circuit for receiving an output from a corresponding one of the input stage inverter, and a second waveform correction circuit for receiving the other of the complementary signals. Each of the waveform correction circuits has a lower output impedance at an initial stage of signal transition of the input signal and a higher output impedance at a subsequent stage of the signal transition.

14 Claims, 5 Drawing Sheets

WAVEFORM CORRECTION CIRCUIT

BACKGROUND OF THE INVENTION (a) Field of the Invention

The present invention relates to a waveform correction circuit and, more particularly, to a waveform correction circuit for use in a duty ratio correction circuit, which is capable of correcting a duty ratio of a pair of complementary signals such as two-phase clock signals. The present invention also relates to such a duty ratio correction circuit.

(b) Description of the Related Art

In a CMOSFET digital logic circuit, each of transmitted signals is generally a single-phase signal, which is different from a pair of differential signals such as used in a bipolar ECL circuit. In general, the single-phase signal involves a difference between a rise time and a fall time thereof due to a difference in the ON-resistance between the pMOSFET which is ON during the rise time and an nMOSFET which is ON during the fall time. This causes a time difference between the duration for a high level and the duration for a low level of the resultant signal, whereby the resultant signal has an irregularity or change in the duty ratio of the waveform. This is considered as one of the fundamental problems to be solved in a CMOS digital logic circuit.

FIG. 1 shows a timing chart of a pair of complementary signals "A" and "A_" having an ideal duty ratio of 5 wherein a concurrent signal transition is achieved between the complementary signals. That is, a rising edge "Ar" of the signal "A" is concurrent with a falling edge "A_f" of the signal "A_", whereas a falling edge "Af" the signal "A" is concurrent with a rising edge "A_r" of the signal "A_".

If these complementary signals "A" and "A_" are transferred by respective CMOSFETs, the resultant signals have a skew therebetween as well as a change in the duty ratio such as shown in FIG. 2, due to irregularities in the fabrication process of the semiconductor devices or a difference in the path length between the signals. In FIG. 2, the signal "A_", for example, has a skew between the ideal falling edge (shown by dotted line) and the actual falling edge "A_f", and a time difference Tcyc between the high-level duration and the low level duration. The time difference Tcyc causes an irregularity of the duty ratio deviating from 50% as indicated in FIG. 2 with reference to the ideal timing "S", A technique for synthesis of pair of signals having therebetween a skew is described in "Technical Digest of VLSI Circuit Symposium 1998". FIG. 3 shows the circuit configuration described in the publication, wherein outputs of a pair of inverters 11 and 12 each receiving one of clock signals φ1 and φ2 having the same clock frequency and a specific phase difference therebetween are connected for synthesis of waveforms or superposition. This provides an intermediate waveform having a median timing between both the clock signals φ1 and φ2 so long as the MOSFETs in both the inverters 11 and 12 have a specific difference in the transistor size therebetween.

More specifically, in FIG. 3, the MOSFETs in the inverter 11 receiving the signal φ1 which advances, for example, in phase with respect to the signal φ2 has a transistor size larger than the transistor size of the MOSFETs in the inverter 12 receiving the signal φ2. In other word, the MOSFETs in the inverter 11 has a lower output impedance compared to the MOSFETs in the inverter 12.

The configuration of FIG. 3 causes a penetrating current flowing between the inverters 11 and 12 during the time interval between the input of the signal φ1 and the input of the signal φ2. The difference in the transistor size as described above accelerates the operation of the MOSFETs in the inverter 11 having a larger transistor size to prevent the reduction in the switching speed caused by the penetrating current and accelerates the switch timing which may otherwise be delayed from the median timing.

In the described technique, it is generally necessary to determine beforehand as to which signal of the pair of signals φ1 and φ2 advances. If the signal φ2 advances with respect to the signal φ1 contrary to the designed circuit configuration, the circuit configuration cannot provide the intended operation.

In addition, the described technique is silent to the problem of the change in the duty ratio.

SUMMARY OF THE INVENTION

It is therefore an object of the present invention to provide a waveform correction circuit for use in a duty ratio correction circuit capable of correcting a pair of complementary signals as to the duty ratio and a skew thereof.

It is another object of the present invention to provide such a duty ratio correction circuit.

The present invention provides, in a preferred embodiment thereof, a waveform correction circuit including input and output terminals, first and second pMOSFETs, first and second nMOSFETs and a delay gate, the first pMOSFET and the first nMOSFET have gates connected together to the input terminal and drains connected together to the output terminal, one of the second pMOSFET and the second nMOSFET being connected between a first source line and a source of the first pMOSFET, the other of the second pMOSFET and the second nMOSFET being connected between a second source line and a source of the nMOSFET, the delay gate having an input connected to the input terminal and an output connected to the gates of the second pMOSFET and the second nMOSFET.

In accordance with the present invention, the waveform correction circuit has a lower output impedance during an initial stage after the signal transition of the input signal and a higher output impedance during a subsequent stage. The waveform correction circuit, if used in the circuit of FIG. 3, affords a suitable waveform for obtaining a median timing between clock signals φ1 and φ2 input through the first and second input terminals. The waveform correction circuit can be also used in a duty ratio correction circuit for correcting the duty ratio of a pair of complementary signals.

The present invention also provides a duty ratio correction circuit including a first circuit block for receiving a first input signal to deliver a first output signal, and a second circuit block for receiving a second input signal which is complementary with the first input signal to deliver a second output signal, each of the first and second circuit blocks including an input stage inverter for receiving one of the first and second input signal, a first inverter circuit for receiving an output from the input stage inverter, a second inverter circuit for receiving the other of the first and second input signals, and an output stage inverter having an input connected to outputs of the first and second inverter circuits.

In accordance with the duty ratio correction circuit, a pair of complementary signals can be corrected to have an improved duty ration and an improved timing for the signal transition.

The above and other objects, features and advantages of the present invention will be more apparent from the following description, referring to the accompanying drawings.

PREFERRED EMBODIMENT OF THE INVENTION

Figure 1:
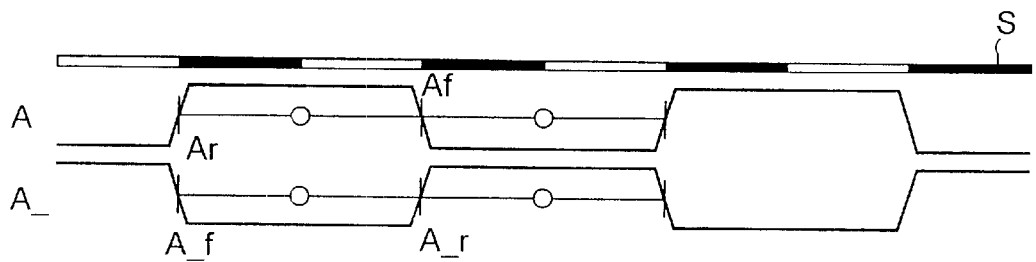
FIG. 1 is a timing chart of a pair of complementary signals having an ideal duty ratio and a concurrent timing.
Figure 2:
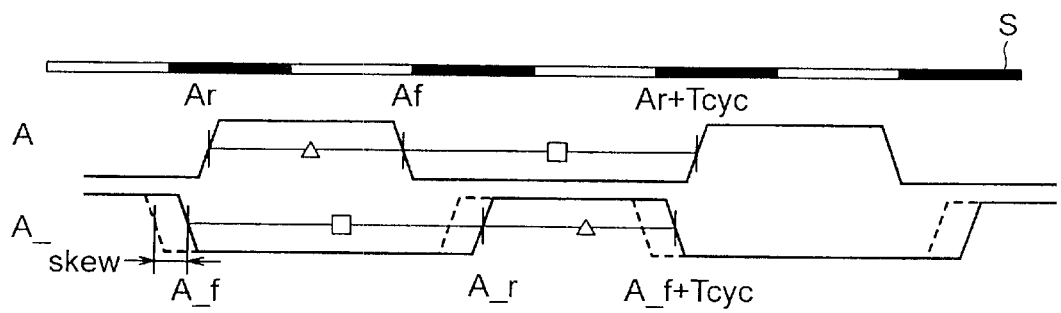
FIG. 2 is another timing chart of a pair of complementary signals having a deviated duty ratio and a deviated timing.

Now, the present invention is more specifically described with reference to accompanying drawings, wherein similar constituent elements are designated by related reference numerals.

Figure 4:
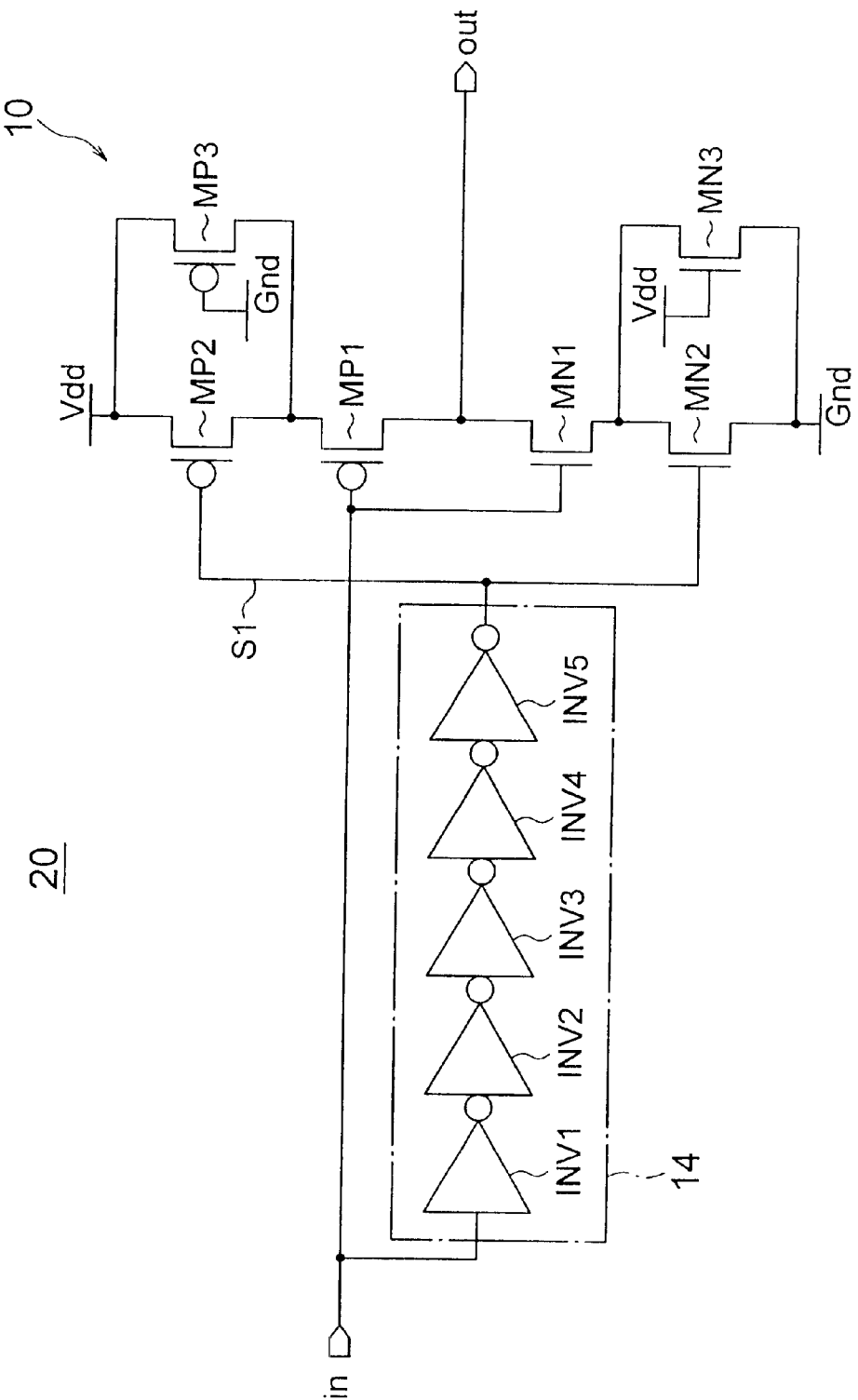
FIG. 4 is a circuit diagram of a waveform correction circuit according to a first embodiment of the present invention.

Referring to FIG. 4, a waveform correction circuit, generally designated by numeral 20, according to a first embodiment of the present invention basically functions as an inverter. The waveform correction circuit or inverter circuit 20 includes a combination circuit 10 acting as an inverter, and a delay circuit 14 including an odd number of inverters INV1 to INV5 and having an input connected to the input terminal. The combination circuit 10 includes a pMOSFET MP1, and an nMOSFET MN1 having a gate and a drain connected to the gate and the drain, respectively, of pMOSFET MP1. The gates of pMOSFET MP1 and nMOSFET MN1 constitute an input node or input terminal of the waveform correction circuit 20, whereas the drains of pMOSFET MP1 and nMOSFET MN1 constitute an output node or output terminal of the waveform correction circuit 20.

The combination circuit 10 further includes a pMOSFET MP2 connected between the source line Vdd and the source of pMOSFET MP1, an nMOSFET MN2 connected between the source of nMOSFET MN1 and the ground. The gates of pMOSFET MP2 and nMOSFET MN2 are connected to the output of the delay circuit 14. The combination circuit 10 also includes a pMOSFET MP3 and an nMOSFET MN3 connected in parallel with pMOSFET MN2 and nMOSFET NM2, respectively. The gate of pMOSFET MP3 is connected to the ground and the gate of nMOSFET MN3 is connected to the source line Vdd.

In the waveform correction circuit 20 of the present embodiment, pMOSFET MP1 and nMOSFET MN1 form an inverter (ordinary inverter) which reverses an input signal to deliver a reversed output signal, with at least pMOSFET MP3 and nMOSFET MN3 being a current path carrying the operational current.

When an input signal rises from a low level to a high level, the pMOSFET MP1 and nMOSFET MN1 are turned OFF and ON, respectively. At this stage, the potential of the gates of pMOSFET MP2 and nMOSFET MN2 remains at a high level until the delay circuit 14 transmits the reversed input signal. Thus, nMOSFET MN1 is ON and assists nMOSFET MN3 to carry the current flowing from the output node to the ground, whereby the combination circuit 10 has a lower output impedance at this initial stage of the signal transition.

After the input signal passes the delay circuit 14, the gates of pMOSFET MP2 and nMOSFET MN2 assume a low level, whereby pMOSFET MP2 and nMOSFET MN2 are turned ON and OFF, respectively. Thus, the current of the combination circuit 10 from the output node flows only through nMOSFET MN2 to the ground, whereby the combination circuit 10 has a higher output impedance at this subsequent stage of the signal transition.

When the input signal falls from a high level to a low level, pMOSFET MP1 and nMOSFET MN1 are turned ON and OFF, respectively. At this stage, the potential of the gates of pMOSFET MP2 and nMOSFET MN2 remains at a low level until the delay circuit 14 passes the reversed input signal. Thus, pMOSFET MP2 is ON and assists pMOSFET MP3 to carry the current flowing from the source line Vdd to the output node, whereby the combination circuit 10 has a lower output impedance at this stage.

After the input signal passes the delay circuit 14, the gates of pMOSFET MP2 and nMOSFET MN2 assume a high level, whereby pMOSFET MP2 and nMOSFET MN2 are turned OFF and ON, respectively. Thus, the current of the combination circuit 10 from the source line flows only through pMOSFET MP2 to the output node, whereby the combination circuit 10 has a higher output impedance at this stage.

In short, after the transition of the input signal, the combination circuit 10 has a lower output impedance until the delay circuit 14 transmits the input signal, and has a higher impedance after the delay circuit 14 transmits the input signal. The actual output impedances are determined by adjusting the transistor sizes of nMOSFETs MN1, MN2 and MN3 for the potential fall of the output node and by adjusting the transistor sizes of pMOSFETs MP1, MP2 and MP3 for the potential rise of the output node.

Figure 3:
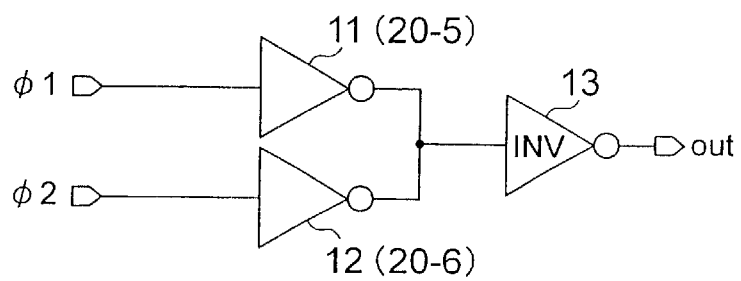
FIG. 3 is a circuit diagram of a conventional waveform correction circuit described in a publication.

The waveform correction circuit of FIG. 4 can be used in the signal synthesis circuit of FIG. 3, as shown by numerals 20-5 and 20-6 in parentheses, which replaces the inverters 11 and 12. This configuration allows the signal synthesis circuit to have a lower output impedance in one of the waveform correction circuits 20-5 and 20-6 which receives the advanced one of the clock signals φ1 and φ2, and a higher impedance in the other of the waveform correction circuits 20-5 and 20-6 which receives the delayed one of the clock signals φ1 and φ2. Thus, the output impedances for the MOSFETs in the waveform correction circuits 20-5 and 20-6 need not be determined beforehand.

In the above embodiment, MOSFETs are used in the waveform correction circuit. However, the present invention can be applied to a broader waveform correction circuit which includes metal-insulated-semiconductor FETs (MISFETs)

Figure 5:
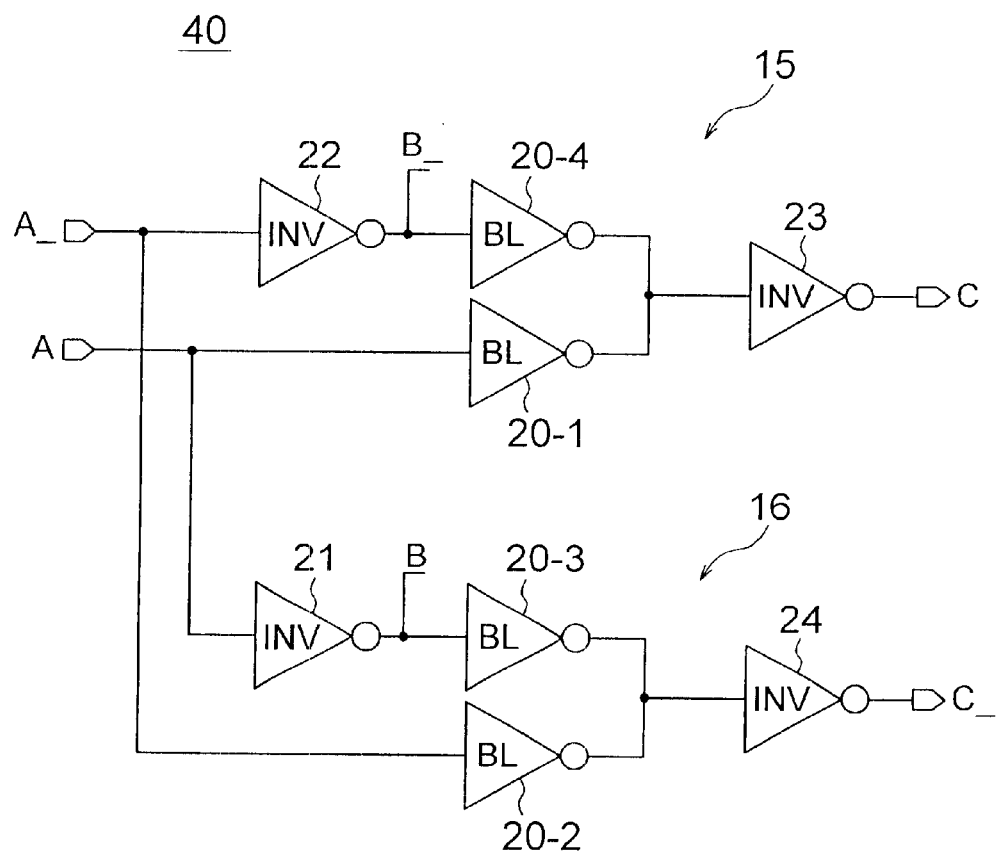
FIG. 5 is a duty ratio correction circuit according to a second embodiment of the present invention.

Referring to FIG. 5, a duty ratio correction circuit 40 according to a second embodiment of the present invention includes first and second circuit blocks 15 and 16 each including a first inverter 22 or 21, a pair of waveform correction circuits 20-4, 20-1 or 20-3, 20-2, such as shown in FIG. 4, and a second inverter 23 or 24. The outputs of both the waveform circuits 20-4, 20-1 or 20-3, 20-2 are connected together to the input of the second inverter 23 or 24.

In the first circuit block 15, the first inverter 22 receives signal "A_" to deliver signal "B_", the waveform correction circuit 20-4 receives signal "B_" from the first inverter 22, the waveform correction circuit 20-1 receives signal "A", and the second inverter 23 receives synthesized signals from both the waveform correction circuits 20-4 and 20-1.

In the second circuit block 16, the first inverter 21 receives signal "A" to deliver signal "B", the waveform correction circuit 20-3 receives signal "B" from the first inverter 21, the waveform correction circuit 20-2 receives signal "A_" and the second inverter 23 receives synthesized signals from both the waveform correction circuits 20-3 and 20-2.

The outputs of both the second inverters 23 and 24 constitute a pair of complementary signals corrected from the complementary signals "A" and "A_" as detailed below.

Figure 6:
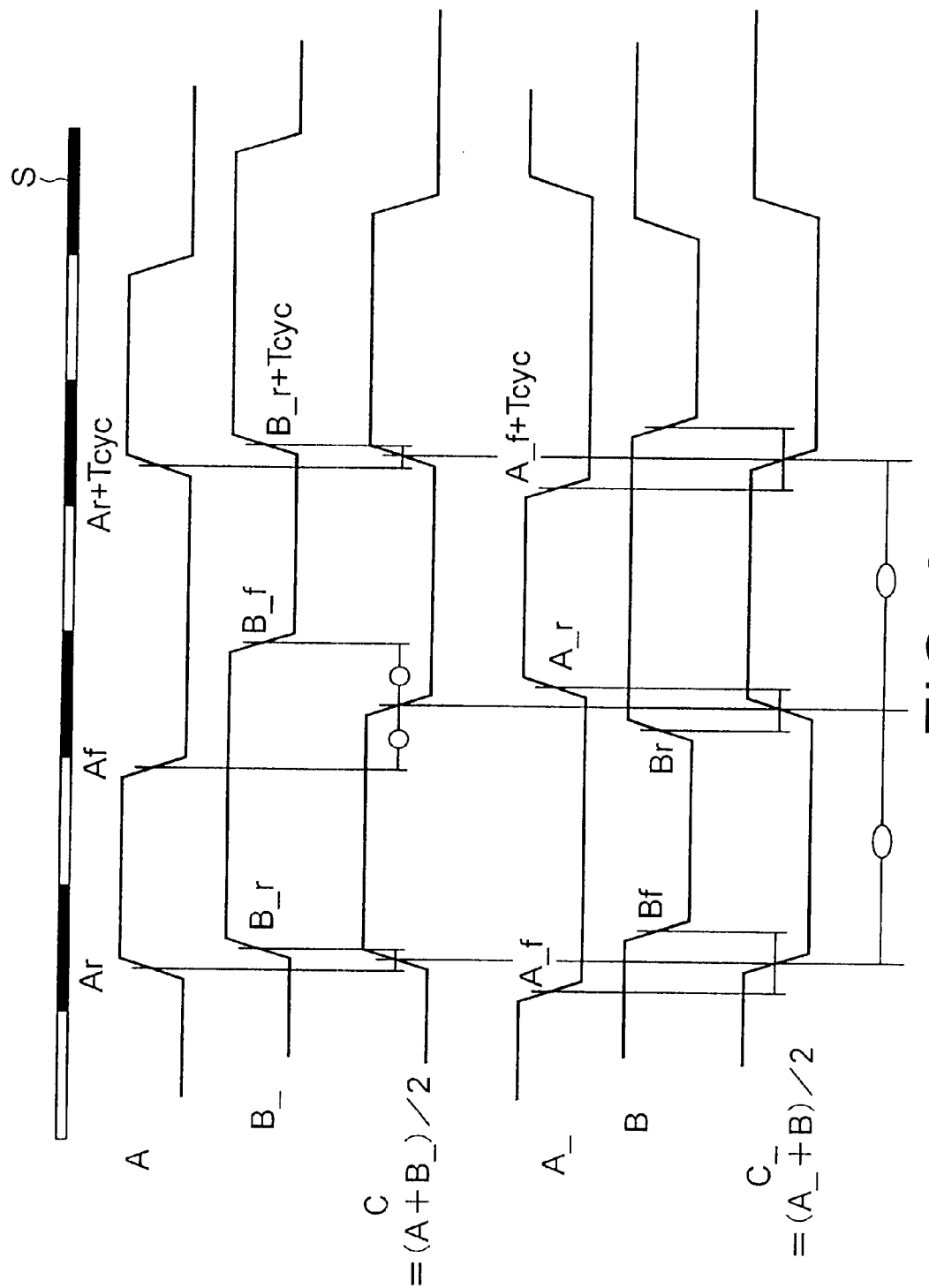
FIG. 6 is a timing chart of signals in the duty ratio correction circuit of FIG. 5.

Referring to FIG. 6, the complementary signals "A" and "A_" have a skew therebetween and each has an irregularity of duty ratio. Signals "B" and "B_" are generated from signals "A" and "A_", respectively. In the first circuit block 15, signals "A" and "B_" which corresponds to the level of signal "A" are synthesized together for obtaining a median timing after inversion thereof in the waveform correction circuits 20-4 and 20-1. The synthesized signal is then inverted by the second inverter to output signal "C" which corresponds to (signal "A" +signal "B_")/2. In the second circuit block 16, signal "C " is generated similarly from the signals "A_" and "B".

In the above operation, since the synthesis of the outputs of both the waveform correction circuits in each circuit block 15 or 16 provides a median timing between signal "A" and signal "B_" or "A_" and "B", the resultant signal "C" or "C_" has a duty ratio of substantially 50%, and both the signals "C" and "C_" have a substantially concurrent timing between the rise of signal "C" and the fall of the signal "C_" and vice versa.

The duty ratio correction circuit 40 of the present embodiment can be used in a two-phase clock system which provides a complementary clock signal. The duty ratio correction circuit 40 may be inserted in the clock system at any position of the clock system to obtain a duty ratio of substantially 50% for the output clock signal.

In a modification of the duty ratio correction circuit of the present embodiment, the waveform correction circuits 20-1 to 20-4 are replaced by ordinary inverters. Although the ordinary inverters cannot provide an accurate median timing of the clock signals, the output signals "C" and "C_" have a corrected timing corrected from the timing of the input signals "A" and "A_" due to the synthesis of the outputs of the inverters, which respectively receive signals "A" and inverted signal "A_", for example, and have outputs connected together.

The first inverters 21 and 22 should have an equal delay, and thus each of the inverters 21 and 22 may include a plurality of cascaded ordinary inverters so long as the overall delay of each of the inverters 21 and 22 is equal to the overall delay of the other of the inverters 21 and 22.

Figure 7:
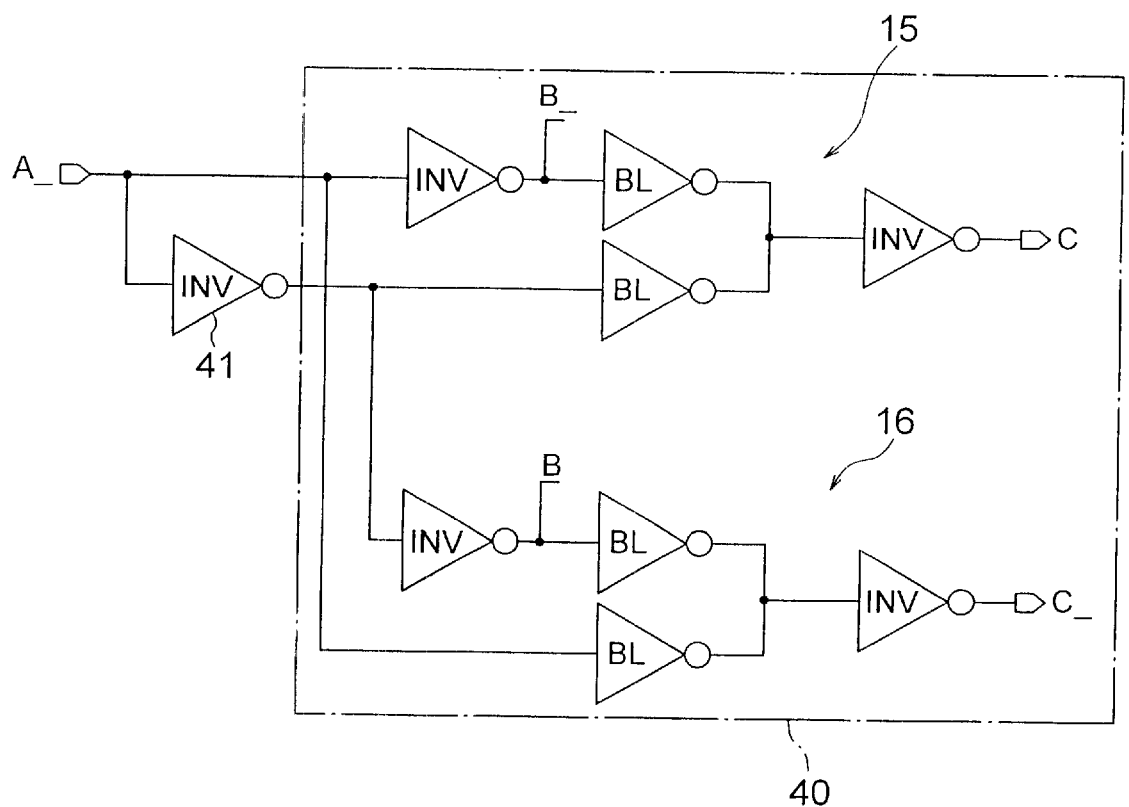
FIG. 7 is circuit diagram of a duty ratio correction circuit according to a third embodiment of the present invention.

The duty ratio correction circuit 40 can be used for a clock system which receives a single clock signal. Such an example is shown in FIG. 7, wherein an inverter 41 is provided in addition to the duty ratio correction circuit 40 shown in FIG. 6 to generate the signal "A_". Although signals "A" and "A_" in FIG. 7 have deviated timings therebetween, the output signal "C" and "C_" have a substantially concurrent timing therebetween.

As described above, the waveform correction circuit 20 of FIG. 4 has a lower output impedance during an initial stage after the signal transition and a higher output impedance during a subsequent stage after the initial stage. A pair of waveform correction circuits 20 receive a pair of input signals which have therebetween different timings and duty ratios deviated from 50%, and output a complementary signals each having a duty ratio of 50%.

Since the above embodiments are described only for examples, the present invention is not limited to the above embodiments and various modifications or alterations can be easily made therefrom by those skilled in the art without departing from the scope of the present invention.

For example, in the first embodiment, the second pMOSFET MP2 and the second nMOSFET MN2 may be reversed in the location, and similarly, the third pMOSFET MP3 and the third nMOSFET MN3 may be reversed in the location.

What is claimed is:

1. A waveform correction circuit comprising input and output terminals, first and second p-type metal insulated-FETs (pMISFETs), first and second nMISFETs and a delay gate, said delay gate comprising an odd numbered plurality of inverters, said first pMISFET and said first nMISFET have gates connected together to said input terminal and drains connected together to said output terminal, said second pMISFET being connected between a first source line and a source of said first pMISFET, said second nMISFET being connected between a second source line and a source of said nMISFET; said delay gate having an input connected to said input terminal and an output connected to said gates of said second pMISFET and said second nMISFET.

2. A waveform correction circuit as defined in claim 1, wherein said delay gate reverses a level of said input terminal to deliver a reversed delay signal to said gates of said second pMISFET and said second nMISFET.

3. The waveform correction circuit as defined in claim 1 further comprising a third pMISFET and a third nMISFET, one and the other of said third pMISFET and said third nMISFET being connected in parallel with said one and said the other, respectively, of said second pMISFET and said second nMISFET.

4. A duty ratio correction circuit comprising a first circuit block for receiving a first input signal to deliver a first output signal, and a second circuit block for receiving a second input signal which is complementary with said first input signal to deliver a second output signal, each of said first and second circuit blocks including an input stage inverter for receiving one of said first and second input signal, a first inverter circuit for receiving an output from said input stage inverter, a second inverter circuit for receiving the other of said first and second input signals, and an output stage inverter having an input connected to outputs of said first and second inverter circuits.

5. The duty ratio correction circuit as defined in claim 4, wherein each of said inverter circuits is an ordinary inverter.

6. The duty ratio correction circuit as defined in claim 4, wherein each of said first and second inverter circuits has a first output impedance during a first stage of signal transition of said input signal and a second output impedance higher than said first output impedance during a subsequent stage of said signal transition.

7. The duty ratio correction circuit as defined in claim 4, wherein each of said inverter circuits includes a delay inverter gate, first and second pMISFETs and first and second nMISFETs, said first pMISFET and said first nMISFET have gates connected together to an input terminal and drains connected together to an output terminal, second pMISFET is connected between a first source line and a source of said first pMISFET, and said second nMISFET is connected between a second source line and a source of said first nMISFET, and said delay inverter gate has an input connected to said input terminal and an output connected to said gates of said second pMISFET and said second nMISFET.

8. The duty ratio correction circuit as defined in claim 7, wherein said inverter circuit further includes a third pMIS- FET and a third nMISFET, and one and the other of said third pMISFET and said third nMISFET is connected in parallel with said one and said the other, respectively, of said second pMISFET and said second nMISFET.

9. The duty ratio correction circuit as defined in claim 8, wherein said first and second input signals are complementary clock signals.

10. The duty ratio correction circuit as defined in claim 8, further comprising a complementary signal generator for receiving said first input signal to output said second input signal to said second circuit block.

11. The duty ratio correction circuit as defined in claim 4, wherein each of said input inverters has an odd number of cascaded ordinary inverters.

12. The duty ratio correction circuit as defined in claim 4, wherein said first and second input signals are complementary clock signals.

13. The duty ratio correction circuit as defined in claim 4, further comprising a complementary signal generator for receiving said first input signal to output said second input signal to said second circuit block.

14. A signal synthesis circuit comprising a first waveform correction circuit for receiving a first pulse signal having a first repetition frequency, a second waveform correction circuit for receiving a second pulse signal having said first repetition frequency, and an inverter having an input connected to outputs of said first and second waveform correction circuits, each of said first and second waveform correction circuits operating as an inverter circuit for receiving an input signal to deliver a reversed input signal, said inverter circuit having a first output impedance during a first stage of signal transition of said input signal and a second output impedance higher than said first output impedance during a subsequent stage of said signal transition.

\* \* \* \* \*